(12) United States Patent
Oomori et al.

(10) Patent No.: US 11,056,456 B2
(45) Date of Patent: Jul. 6, 2021

(54) SEMICONDUCTOR APPARATUS

(71) Applicant: SUMITOMO ELECTRIC INDUSTRIES, LTD., Osaka (JP)

(72) Inventors: Hirotaka Oomori, Osaka (JP); Takashi Tsuno, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/961,790

(22) PCT Filed: Dec. 3, 2018

(86) PCT No.: PCT/JP2018/044398
§ 371 (c)(1),
(2) Date: Jul. 13, 2020

(87) PCT Pub. No.: WO2019/146259
PCT Pub. Date: Aug. 1, 2019

(65) Prior Publication Data
US 2021/0066236 A1 Mar. 4, 2021

(30) Foreign Application Priority Data

Jan. 25, 2018 (JP) .............................. JP2018-010263

(51) Int. Cl.
*H01L 23/00* (2006.01)
(52) U.S. Cl.
CPC .............. *H01L 24/48* (2013.01); *H01L 24/06* (2013.01); *H01L 24/49* (2013.01)
(58) Field of Classification Search
CPC .......... H01L 24/48; H01L 24/06; H01L 24/49
See application file for complete search history.

(56) References Cited

U.S. PATENT DOCUMENTS

| 2014/0077349 A1* | 3/2014 | Higgins, III | H01L 24/13 257/692 |
| 2018/0040780 A1* | 2/2018 | Hirasawa | H01L 33/486 |

FOREIGN PATENT DOCUMENTS

| JP | 2009-188164 | 8/2009 |
| JP | 2014-203947 | 10/2014 |
| JP | 2016-195224 | 11/2016 |

* cited by examiner

*Primary Examiner* — Marc Anthony Armand
(74) *Attorney, Agent, or Firm* — IPUSA, PLLC

(57) ABSTRACT

A semiconductor apparatus includes a base plate, a metal plate disposed on the base plate, a bonding material disposed between the base plate and the metal plate to be in surface-to-surface contact with the base plate and the metal plate to bond the metal plate to the base plate, an insulating plate disposed on the metal plate, a circuit member disposed on the insulating plate to be in surface-to-surface contact with the insulating plate, a semiconductor device mounted on the circuit member, and an encapsulating material covering the metal plate, the bonding material, the insulating plate, the circuit member, and the semiconductor device to encapsulate an area over the base plate, wherein a bottom face area of the metal plate along the outer perimeter of the metal plate is not covered with the bonding material, wherein the base plate has a groove-shape recess that is disposed along the outer perimeter of the metal plate to face the bottom surface area, wherein the recess has an area having a first depth and a deeper area deeper than the first depth, and the deeper area is disposed beside an inner-side sidewall of the recess, and wherein at least a portion of the deeper area has the bonding material disposed therein.

12 Claims, 5 Drawing Sheets

US 11,056,456 B2

SEMICONDUCTOR APPARATUS

TECHNICAL FIELD

The disclosures herein relate to a semiconductor apparatus.

The present application claims priority to Japanese application No. 2018-010263 filed on Jan. 25, 2018, and the entire contents of the Japanese application are hereby incorporated by reference.

BACKGROUND ART

A semiconductor apparatus as known in the art includes a laminated substrate that has a circuit board having a semiconductor chip secured thereon and that is encapsulated with a hard resin.

RELATED-ART DOCUMENTS

Patent Document

[Patent Document 1] Japanese Laid-open Patent Publication No. 2016-195224

SUMMARY OF THE INVENTION

A semiconductor apparatus according to an embodiment includes a base plate, a metal plate disposed on the base plate, a bonding material disposed between the base plate and the metal plate to be in surface-to-surface contact with the base plate and the metal plate to bond the metal plate to the base plate, an insulating plate disposed on the metal plate, a circuit member disposed on the insulating plate to be in surface-to-surface contact with the insulating plate, a semiconductor device mounted on the circuit member, and an encapsulating material covering the metal plate, the bonding material, the insulating plate, the circuit member, and the semiconductor device to encapsulate an area over the base plate. A bottom surface area of the metal plate along the outer perimeter of the metal plate is not covered with the bonding material. The base plate has a groove-shape recess that is disposed along the outer perimeter of the metal plate to face the bottom surface area. The recess has an area having a first depth and a deeper area deeper than the first depth, and the deeper area is disposed beside an inner-side sidewall of the recess when an inner side is defined as being situated further inside, away from the outer perimeter of the metal plate. At least a portion of the deeper area has the bonding material disposed therein

MODE FOR CARRYING OUT THE INVENTION

Figure 1:
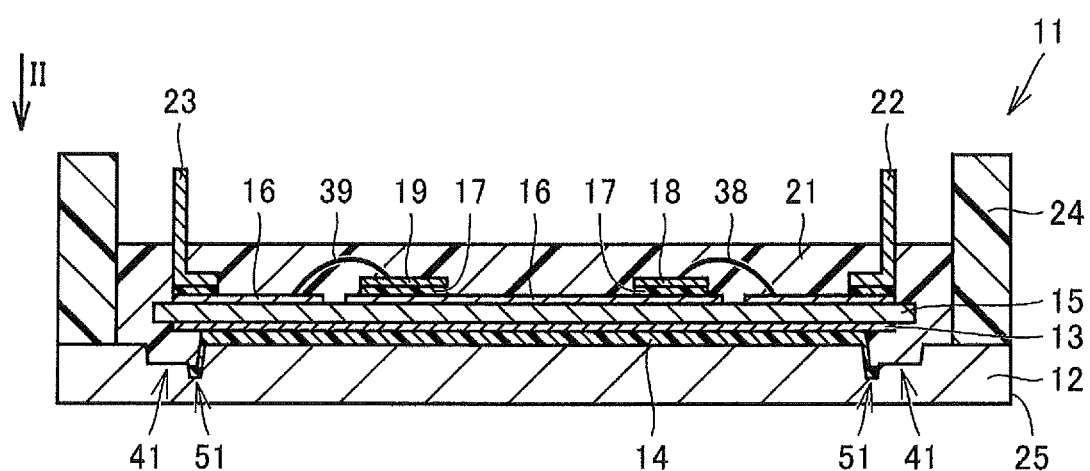
FIG. 1 is a schematic cross-sectional view illustrating the configuration of a semiconductor apparatus according to an embodiment.

Patent Document 1 discloses a semiconductor apparatus that includes a base plate and an encapsulating material, such that the base plate is bonded to a bottom face of a metal plate, and has a recess in at least a portion of an area facing the edges of the metal plate in the surface that is bonded to the metal plate, and such that the encapsulating material is comprised of a hard resin, and is in contact with a semiconductor chip, an insulating plate, a circuit board, the side surface of the metal plate, and the bottom surface of the metal plate facing the recess. A portion of a groove serving as the recess and filled with the encapsulating material provides an anchor effect.

In Patent Document 1, no plating is performed on the bottom surface and side surfaces of the groove in order to prevent a solder for bonding the metal plate and the base plate from entering the groove. In the case of no plating being performed, however, an excess bonding material, if any, wets and spreads over the metal plate, or results in the formation of a bonding material mass at the boundary between the metal plate and the bonding material. This may cause interfacial separation between the encapsulating material and other components, or may result in the cracking of components of the laminated substrate due to the influence of residual stress. Such a semiconductor apparatus suffers reduction in reliability.

Further, it may be conceivable that the amount of bonding material be adjusted to an appropriate amount to prevent an excess bonding material from entering the groove. However, precise control of the amount of bonding material is difficult to achieve, which may prevent efficient manufacturing of semiconductor apparatuses.

Accordingly, one of the objects of the present disclosures is to provide a highly reliable semiconductor apparatus that can be efficiently manufactured.

[Description of Embodiments of Disclosed Technology]

Embodiments of the technologies of the present disclosures will be listed and described first. A semiconductor apparatus according to the present disclosures includes a base plate, a metal plate disposed on the base plate, a bonding material disposed between the base plate and the metal plate to be in surface-to-surface contact with the base plate and the metal plate to bond the metal plate to the base plate, an insulating plate disposed on the metal plate, a circuit member disposed on the insulating plate to be in surface-to-surface contact with the insulating plate, a semiconductor device mounted on the circuit member, and an encapsulating material covering the metal plate, the bonding material, the insulating plate, the circuit member, and the semiconductor device to encapsulate an area over the base plate. A bottom face area of the metal plate along the outer perimeter of the metal plate is not covered with the bonding material. The base plate has a groove-shape recess that is disposed along the outer perimeter of the metal plate to face the bottom surface area. The recess has an area having a first depth and a deeper area deeper than the first depth, and the deeper area is disposed beside an inner-side sidewall of the recess when an inner side is defined as being situated further inside, away from the outer perimeter of the metal plate. At least a portion of the deeper area has the bonding material disposed therein According to the above-noted semiconductor apparatus, the base plate has a groove-shape recess disposed along the outer perimeter of the metal plate to face the bottom surface area, so that the cracking of components constituting the semiconductor apparatus caused by hardening and shrinking of the encapsulating material may be reduced Namely, provision of the recess provides an anchor effect.

Further, the recess has an area having a first depth and a deeper area deeper than the first depth, and the deeper area is disposed beside an inner-side sidewall of the recess when an inner side is defined as being situated further inside, away from the outer perimeter of the metal plate. As a result, even when there is an excessive amount of bonding material, the excess bonding material is allowed to flow into the deeper area when the metal plate and the base plate are bonded together. With this arrangement, the flowing of excess bonding material into the other area in the recess (i.e., the area having the first depth) is unlikely to occur. Here, the other area in the recess refers to the area other than the deeper area in the recess. Further, it is possible to reduce the risk that the excess bonding material wets and spreads over the bottom surface area along the outer perimeter or turns into a mass between the metal plate and the bonding material. Moreover, there will be no need to perform precise control of the amount of bonding material. Bringing the encapsulating material in direct contact with the sidewall defining the recess in the other area of the recess allows the encapsulating material disposed inside the recess to provide a sufficient anchor effect. Accordingly, the structure noted above provides a highly reliable semiconductor apparatus that can be efficiently manufactured.

In the semiconductor apparatus, the inner-side sidewall and the upper surface of the base plate placed in contact with the bonding material may be configured to meet each other at an obtuse angle. This arrangement allows an excess bonding material to readily flow into the deeper area. Further, it is possible to reduce the occurrence of voids that would be created when air is trapped between the flow of an incoming bonding material and the inner-side sidewall.

In the semiconductor apparatus, the deeper area may be configured such that the width increases toward the upper end thereof. This arrangement allows an excess bonding material to readily flow into the deeper area.

In the semiconductor apparatus, the depth of the deeper area from the area having the first depth may be configured to be less than or equal to the thickness of the bonding material. This arrangement allows the base plate and the metal plate to be more properly bonded through the bonding material.

In the semiconductor apparatus, the bonding material is solder, and the inner-side sidewall is provided with a plating layer that has higher solder wettability than the surface of the base plate facing the metal plate. This arrangement allows an excess bonding material overflowing from the surface of the base plate facing the metal plate to more readily flow into the deeper area.

In the semiconductor apparatus, the bonding material is solder, and at least a portion of the bottom surface area of the metal plate is provided with a plating layer that has lower solder wettability than the surface of the metal plate facing the base plate. This arrangement prevents a bonding material from wetting and spreading over the surface of the metal plate facing the base plate.

In the semiconductor apparatus, the shortest distance between the semiconductor device and the bottom surface of the deeper area in a plan view as viewed in the thickness direction of the base plate may be configured to be greater than the distance between the upper surface of the circuit member and the bottom surface of the deeper area in the thickness direction of the base plate. This arrangement more reliably prevents reduction in the heat dissipation of generated heat from the semiconductor device to the base plate.

In the semiconductor apparatus, the recess may form a continuous loop in a plan view as viewed in the thickness direction of the base plate. This arrangement allows an anchor effect to be more reliably provided, and allows an excess bonding material to efficiently flow into the deeper area in the circumferential direction.

In the semiconductor apparatus, a plurality of recesses may be disposed at spaced intervals in the circumferential direction along the outer perimeter of the metal plate. This arrangement allows the recesses to be provided at more proper locations.

[Details of Embodiments of Disclosed Technology]

In the following, a semiconductor apparatus according to an embodiment of the technology of the present disclosures will be described with reference to the drawings. In the following drawings, the same or corresponding elements are referred to by the same numerals, and a duplicate description thereof will be omitted.

First Embodiment

Figure 2:
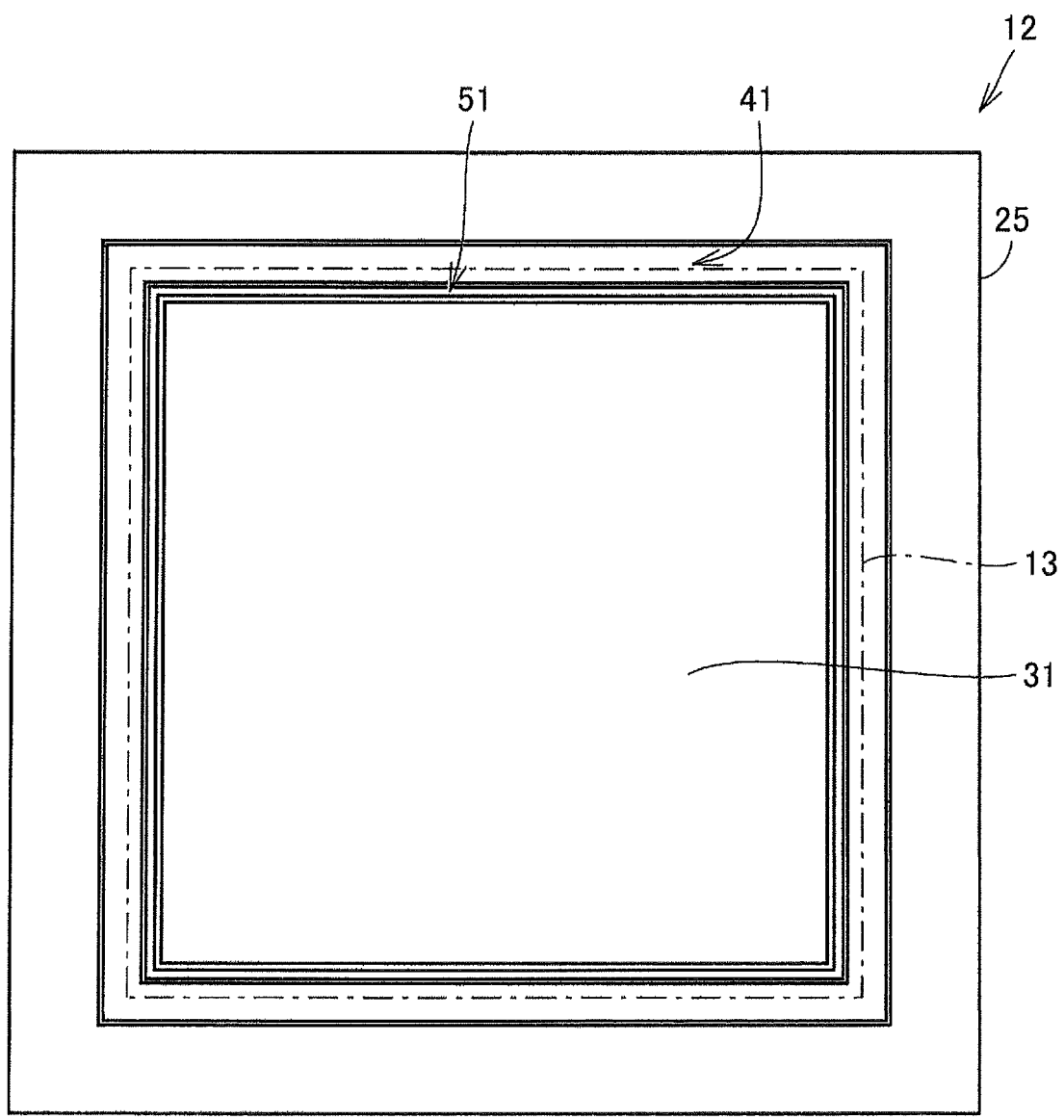
FIG. 2 is a drawing illustrating the way in which a base plate provided in the semiconductor apparatus illustrated in FIG. 1 appears in a plan view as viewed in the thickness direction.
Figure 3:
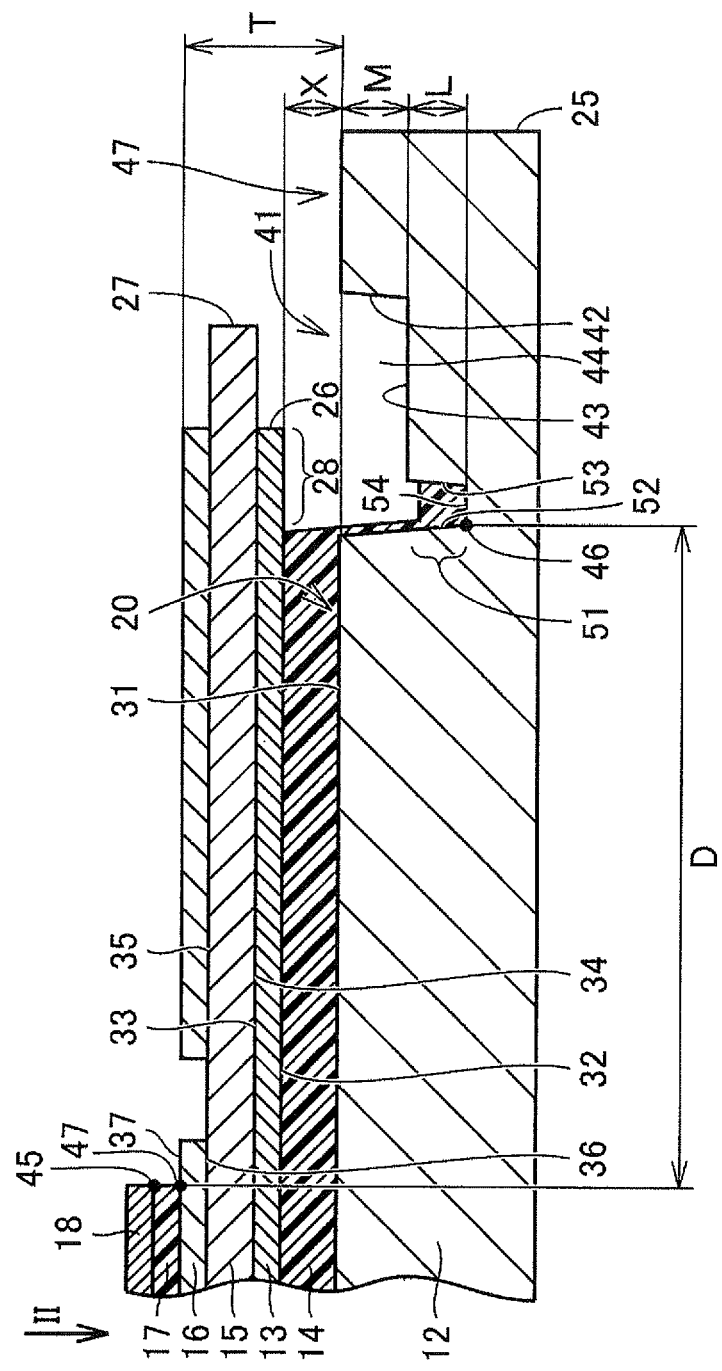
FIG. 3 is an enlarged cross-sectional view of a portion of the semiconductor apparatus illustrated in FIG. 1.

FIG. 1 is a schematic cross-sectional view illustrating the configuration of a semiconductor apparatus according to an embodiment. FIG. 2 is a drawing illustrating the way in which a base plate provided in the semiconductor apparatus illustrated in FIG. 1 appears in a plan view as viewed in the thickness direction of the base plate. FIG. 3 is an enlarged cross-sectional view of a portion of the semiconductor apparatus illustrated in FIG. 1. It may be noted that FIG. 3 illustrates the semiconductor apparatus of FIG. 1 in the state in which an encapsulating material and the like are removed. FIG. 1 and FIG. 3 correspond to the cross-section of the semiconductor apparatus that is taken along the thickness direction of the base plate. FIG. 2 illustrates the base plate as viewed in the thickness direction of the base plate, and corresponds to the case in which the view is taken in the direction indicated by an arrow II in FIG. 1. For the sake of ease of understanding, the outer perimeter of a metal plate is illustrated in dot-and-dash lines in FIG. 2.

Referring to FIG. 1 through FIG. 3, a semiconductor apparatus 11 according to the embodiment includes a base plate 12, a metal plate 13, bonding materials 14 and 17, an insulating plate 15, a circuit member 16, semiconductor devices 18 and 19, an encapsulating material 21, terminals 22 and 23, and an outer frame 24. The metal plate 13, the insulating plate 15, and the circuit member 16 are stacked one over another from the lowest layer in the following order: the metal plate 13, the insulating plate 15, and the circuit member 16.

The outer shape of the base plate 12 serving as a base for the semiconductor apparatus 11 is rectangular. The base plate 12 has a surface 31 located one side of the base plate 12 in the thickness direction thereof. Component members such as the metal plate 13, the insulating plate 15, and the circuit member 16 are disposed on the surface 31. As the material of the base plate 12, a material having high thermal conductivity is selected, specific examples of which include a metal material such as copper or aluminum, and a composite material made by combining a metal and a ceramic. The semiconductor apparatus 11 illustrated in FIG. 1 is configured such that the metal plate 13 is disposed on the surface 31. It may be noted, however, that the arrangement of these members relative to each other is reversed upside down when the semiconductor apparatus 11 is turned upside down, for example. Namely, when the semiconductor apparatus 11 is turned upside down, the phrase "the metal plate 13 is disposed on the surface 31" refers to the fact that the metal plate 13 is disposed beneath the surface 31. The same applies to the arrangement of the members relative to each other in the case in which the semiconductor apparatus 11 is installed in a laterally facing position or at an oblique angle. The structure of the base plate 12 will be described later in detail.

The metal plate 13 is disposed on the surface 31. The outer shape of the metal plate 13 is also rectangular. In the plan view viewed in the thickness direction, the outer perimeter 26 of the metal plate 13 is situated on an inner side relative to the outer perimeter 25 of the base plate 12. The metal plate 13 has a surface 32 facing toward the surface 31, and has a surface 33 located opposite from the surface 32 in the thickness direction of the base. plate 12 The surface 32 includes an area 28 that is defined to include the outer perimeter 26 and that is exposed beyond the bonding material 14. Here, the term "exposed" refers to the fact that the surface 32 is not covered with the bonding material 14. In other words, the area 28 which is not covered with the bonding material 14 is a bottom surface area of the metal plate 13 along the outer perimeter 26 of the metal plate 13. The metal plate 13 is made of a thin metal material having electrical conductivity, for example. Specifically, copper foil or the like is used as the metal plate 13. The metal plate 13 is bonded to the base plate 12 through the bonding material 14.

The bonding material 14 is placed in surface-to-surface contact with both the surface 31 and the surface 32. Namely, the bonding material 14 is provided as an intervening member between the base plate 12 and the metal plate 13. Solder may be used as the bonding material 14, for example. It may be noted that the area of the surface 31 placed in contact with the bonding material 14 may be plated so as to be more wettable with respect to the bonding material 14.

The insulating plate 15 is disposed in contact with the surface 33. The outer shape of the insulating plate 15 is also rectangular. In the plan view viewed in the thickness direction of the base plate 12, the outer perimeter 27 of the insulating plate 15 is situated on an inner side relative to the outer perimeter 25 of the base plate 12, and is situated on an outer side relative of the outer perimeter 26 of the metal plate 13. The insulating plate 15 has a surface 34 facing toward the surface 33, and has a surface 35 located opposite from the surface 34 in the thickness direction of the base plate 12 The insulating plate 15 is made of a ceramic having an insulating property, for example. Specific examples of such a material include aluminum oxide, aluminum nitride, silicon nitride, and the like. In the noted configuration, the thickness direction of the base plate 12 and the thickness direction of the insulating plate 15 are the same.

The circuit member 16 is disposed in contact with the surface 35. The circuit member 16 has circuit patterns formed therein. The circuit member 16 has a surface 36 facing toward the surface 35, and has a surface 37 located opposite from the surface 36 in the thickness direction of the base plate 12 The circuit member 16 is made of a thin metal material having electrical conductivity, for example, similarly to the metal plate 13.

The surface 37 has semiconductor devices 18 and 19 mounted thereon via a bonding material 17. Namely, the semiconductor devices 18 and 19 are bonded and secured to the surface 37 through the bonding material 17. The semiconductor devices 18 and 19 are electrically connected through bonding wires 38 and 39, respectively, to portions of the circuit member different from the portions on which the semiconductor devices 18 and 19 are mounted. The present embodiment is directed to the configuration in which the semiconductor devices 18 and 19 are mounted. Alternatively, the number, arrangement, and the like of semiconductor devices are selected as desired according to the configuration of the semiconductor apparatus 11.

Terminals 22 and 23 are electrically connected to, and secured to, portions of the circuit member 16 different from the portions on which the semiconductor devices 18 and 19 are mounted. Terminals 22 and 23 are implemented as a metal member in a bent shape, for example. The ends of the terminals 22 and 23 opposite the ends connected to the circuit member 16 are exposed without being encapsulated in the encapsulating material 21.

The encapsulating material 21 covers the metal plate 13, the bonding materials 14 and 17, the insulating plate 15, the circuit member 16, the semiconductor devices 18 and 19 to encapsulate an area over the surface 31. A resin having a high insulation property and heat resistance is used for the encapsulating material 21. Specifically, an epoxy resin or a phenolic resin serving as a thermosetting resin is used. According to need, filler may be added to the encapsulating material 21 in order to improve insulation performance and the like, for example.

An outer frame 24 is mounted on the surface 31 along the outer perimeter 25 of the base plate 12. The outer frame 24 serves to enclose the space over the surface 31, except for the upper side in the thickness direction of the base plate 12. An uncured epoxy resin or the like is poured into, and hardened in, the space surrounded by the outer frame 24 as described above, thereby forming the encapsulating material 21.

In the following, a specific shape of the base plate 12 will be described. The surface 31 of the base plate 12 is provided with a groove-shape recess 41 that is disposed along the outer perimeter 26 of the metal plate 13. The recess 41 is situated opposite the area 28 extending beyond the bonding material 14 in a plan view as viewed in the thickness direction of the base plate 12. The recess 41 is continuously provided in a loop shape. It suffices for the base plate 12 to have such a width as to allow the liquid encapsulating material 21 to flow therein.

The recess 41 has a deeper area 51 that is deeper than a remaining area 44 and that is situated beside an inner-side sidewall 52 defining the recess 41 in the plan view as viewed in the thickness direction of the base plate 12. Namely, the recess 41 is constituted by the deeper area 51 and the remaining area 44. In other words, the recess 41 has the area 44 having a first depth and the deeper area 51 deeper than the first depth, and the deeper area 51 is disposed beside the inner-side sidewall 52 of the recess 41. Here, the term "inner-side sidewall" refers to a sidewall that is situated on the inner side of the recess 41 when the inner side is defined as being situated further inside, away from the outer perimeter 26 of the metal plate 13.

The surfaces that define the remaining area 44 include a sidewall 42 situated toward the outer perimeter 25 and a bottom surface 43. At the surface 31, an area 47 adjoining the recess 41 and the sidewall 42 defining the remaining area 44 meet each other at an obtuse angle. The bottom surface 43 extends parallel to the surface 31. The depth of the remaining area 44 is less than or equal to half the thickness of the base plate 12, for example. The encapsulating material 21 is disposed in the remaining area 44 of the recess 41. Provision of the recess 41 as described above provides an anchor effect.

The surfaces that define the deeper area 51 include the inner-side sidewall 52, an outer-side sidewall 53 closer to the outer perimeter 25, and a bottom surface 54. At the surface 31, the inner-side sidewall 52 and an area 20 adjoining the deeper area (i.e., the upper surface of the base plate 12 placed in contact with the bonding material 14) meet each other at an obtuse angle. The outer-side sidewall 53 and the bottom surface 43 meet each other at an obtuse angle. The bottom surface 54 extends parallel to the surface 31. In the cross-section illustrated in FIG. 3, the deeper area 51 is configured such that the width thereof increases toward the upper end (i.e., the mouth of the opening) thereof. At least a portion of the deeper area 51 has the bonding material 14 disposed therein. In the state illustrated in FIG. 3, the bonding material 14 is situated substantially in the entirety of the deeper area 51.

The depth of the deeper area 51 from the remaining area 44 is set to be less than or equal to the thickness of the bonding material 14, for example. Specifically, the thickness X of the bonding material 14 in the thickness direction of the base plate 12 illustrated in FIG. 3 is 0.1 mm. The length L in the thickness direction between the bottom surface 43 and the bottom surface 54, which corresponds to the depth of the deeper area 51, is set to be less than or equal to the thickness X.

In the cross-section illustrated in FIG. 3, the distance D, in the direction perpendicular to the thickness of the base plate 12, between a portion 47 of the circuit member 16 corresponding to an end 45 of the semiconductor device 18 closest to the outer perimeter and an end 46 of the inner-side sidewall 52 at the deepest point farthest away from the outer perimeter in the plan view as viewed in the thickness direction of the base plate 12 is greater than the distance obtained by summing the total thickness T of the bonding material 14, the metal plate 13, the insulating plate 15, and the circuit member 16, the depth M of the recess 41, and the depth L of the deeper area 51. The shortest distance D between the semiconductor device 18 and the bottom surface of the deeper area 51 in a plan view as viewed in the thickness direction of the base plate 12 may be greater than the distance (T+M+L) between the upper surface of the circuit member 16 and the bottom surface of the deeper area 51 in the thickness direction of the base plate 12.

In the following, a method of making the semiconductor apparatus 11 having the above-descried configuration will be described. With respect to the semiconductor apparatus 11 described above, first, the metal plate 13, the insulating plate 15, and the circuit member 16 are stacked one over another. Among the stacked plates, the surface 32 and the surface 31 are bonded through the bonding material 14. A liquid encapsulating material 21 in an uncured state is then injected and hardened to provide encapsulation.

In bonding the surface 32 and the surface 31, a bonding material 14 made of a solder paste is used, for example. The solder paste serving as the bonding material 14 is disposed on the surface 31 and melts by heat to wet and spread over the surface 31. During this process, an excess portion of the wetting and spreading solder flows into the deeper area 51. Namely, it is possible to reduce the risk of an excess bonding material 14 flowing into the remaining area 44 of the recess 41 or wetting and spreading over the surface 32. As a result, at least a portion of the deeper area 51 has the bonding material 14 disposed therein. In this manner, the semiconductor apparatus 11 is manufactured.

According to the semiconductor apparatus 11 having the above-noted configuration, the surface 31 has the groove-shape recess 41 positioned to face the area 28 exposed beyond the bonding material 14 in the plan view as viewed in the thickness direction of the base plate 12, so that the cracking of components constituting the semiconductor apparatus 11 caused by hardening and shrinking of the encapsulating material 21 may be reduced. Namely, provision of the recess 41 provides an anchor effect.

Further, the recess 41 has the deeper area 51 that is deeper than the remaining area 44 and that is situated beside the inner-side sidewall 52 in the plan view as viewed in the thickness direction of the base plate 12, so that even when there is an excessive amount of bonding material 14, the excess bonding material 14 is allowed to flow into the deeper area 51 when the metal plate 13 is bonded to the base plate 12. With this arrangement, the flowing of excess bonding material 14 into the remaining area 44 of the recess 41 does not readily occur. Further, it is possible to reduce the risk of the excess bonding material 14 wetting and spreading over the area 28 exposed beyond the bonding material 14 or forming a mass between the metal plate 13 and the bonding material 14. Moreover, there will be no need to perform precise control of the amount of bonding material 14. Bringing the encapsulating material 21 in direct contact with the sidewall defining the recess 41 in the remaining area 44 of the recess allows the encapsulating material 21 disposed inside the recess 41 to provide a sufficient anchor effect. Accordingly, use of the structure noted above provides a highly reliable semiconductor apparatus 11 that can be efficiently manufactured.

In the present embodiment, the inner-side sidewall 52 and the area 20 adjoining the deeper area 51 meet each other at an obtuse angle at the surface 31. This arrangement allows the excess bonding material 14 to readily flow into the deeper area. Further, it is possible to reduce the occurrence of voids that would be created when air is trapped between the flow of an incoming bonding material 14 and the inner-side sidewall 52.

In the cross-section illustrated in FIG. 3, the deeper area 51 of the present embodiment is configured such that the width thereof increases toward the upper end (i.e., the mouth of the opening) thereof. This arrangement allows the excess bonding material 14 to readily flow into the deeper area 51.

In the present embodiment, the depth of the deeper area 51 from the remaining area 44 is less than or equal to the thickness of the bonding material 14. This arrangement allows the base plate 12 and the metal plate 13 to be more properly bonded through the bonding material 14.

In the present embodiment, as shown in the cross-section illustrated in FIG. 3, the distance D, in the direction perpendicular to the thickness of the base plate 12, between a portion 47 of the circuit member 16 corresponding to an end 45 of the semiconductor device 18 closest to the outer perimeter and an end 46 of the inner-side sidewall 52 at the deepest point farthest away from the outer perimeter in the plan view as viewed in the thickness direction of the base plate 12 is greater than the distance obtained by summing the total thickness T of the bonding material 14, the metal plate 13, the insulating plate 15, and the circuit member 16, the depth M of the recess 41, and the depth L of the deeper area 51. This arrangement more reliably prevents reduction in the heat dissipation of generated heat from the semiconductor device 18 to the base plate 12.

Second Embodiment

Figure 4:
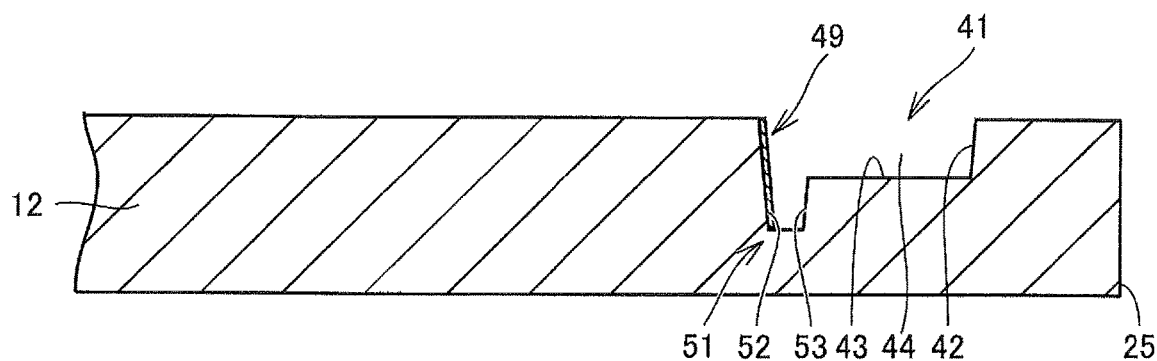
FIG. 4 is a schematic cross-sectional view illustrating a portion of the configuration of a semiconductor apparatus according to another embodiment.

It may be noted that when the bonding material 14 is solder in the above-described embodiment, the inner-side sidewall 52 may be provided with a plating layer that has higher solder wettability than the surface 31. FIG. 4 is a schematic cross-sectional view illustrating a portion of the configuration of a semiconductor apparatus according to another embodiment. In reference to FIG. 4, the inner-side sidewall 52 is provided with a plating layer 49 that has higher solder wettability than the surface 31. For the sake of ease of understanding, the plating layer 49 is shown thicker. This arrangement allows an excess bonding material 14 overflowing from the surface 31 to more readily flow into the deeper area 51.

In this case, solder wettability may be evaluated by using the wetting spread test or the meniscograph test, for example.

Third Embodiment

Figure 5:
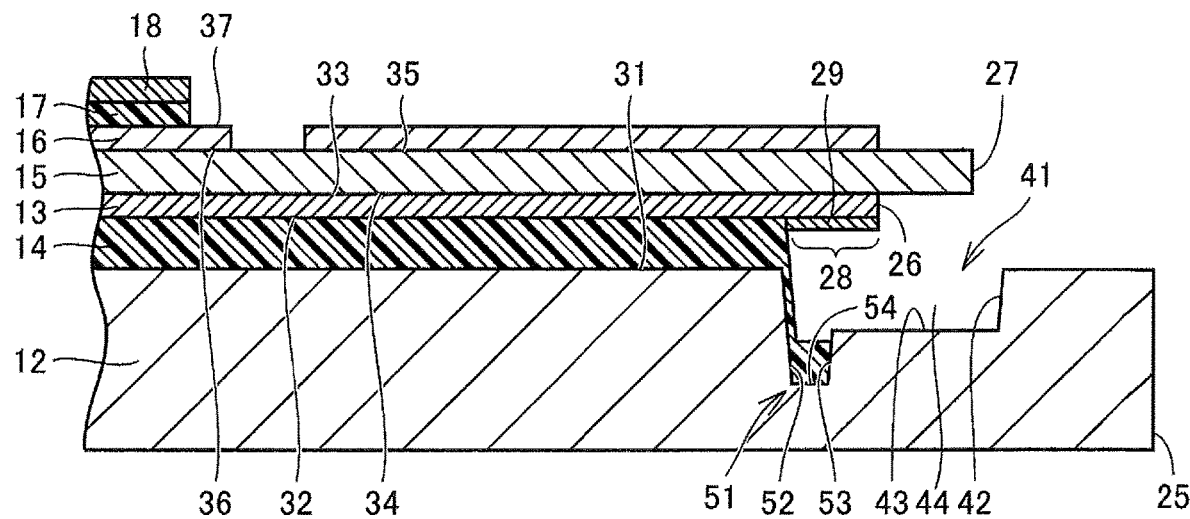
FIG. 5 is a schematic cross-sectional view illustrating a portion of the configuration of a semiconductor apparatus according to yet another embodiment.

It may be noted that when the bonding material 14 is solder in the above-described embodiments, at least a part of the area 28 exposed beyond the bonding material 14 may be provided with a plating layer that has lower solder wettability than the surface 32. FIG. 5 is a schematic cross-sectional view illustrating a portion of the configuration of a semiconductor apparatus according to yet another embodiment. FIG. 5 corresponds to FIG. 3.

In reference to FIG. 5, the metal plate 13 provided in the semiconductor apparatus according to another embodiment is such that at least a part of the area 28 (i.e., the bottom surface area of the metal plate 13 along the outer perimeter 26 of the metal plate 13) exposed beyond the bonding material 14 is provided with a plating layer 29 that has lower solder wettability than the surface 32. In the illustrated case, the plating layer 29 is disposed over the entirety of the area 28 exposed beyond the bonding material 14. For the sake of ease of understanding, the plating layer 29 is shown thicker. In the case of solder being used as the bonding material 14, the plating layer 29 may be implemented as a chromium plating layer, for example. This arrangement prevents the bonding material 14 from wetting and spreading over the surface 31. It may be noted that when the plating layer 29 is disposed on part of the area 28 extending beyond the bonding material 14, the place of disposition is preferably situated further toward the inner side to the extent possible, i.e., as far away from the outer perimeter 26 as possible.

Fourth Embodiment

Figure 6:
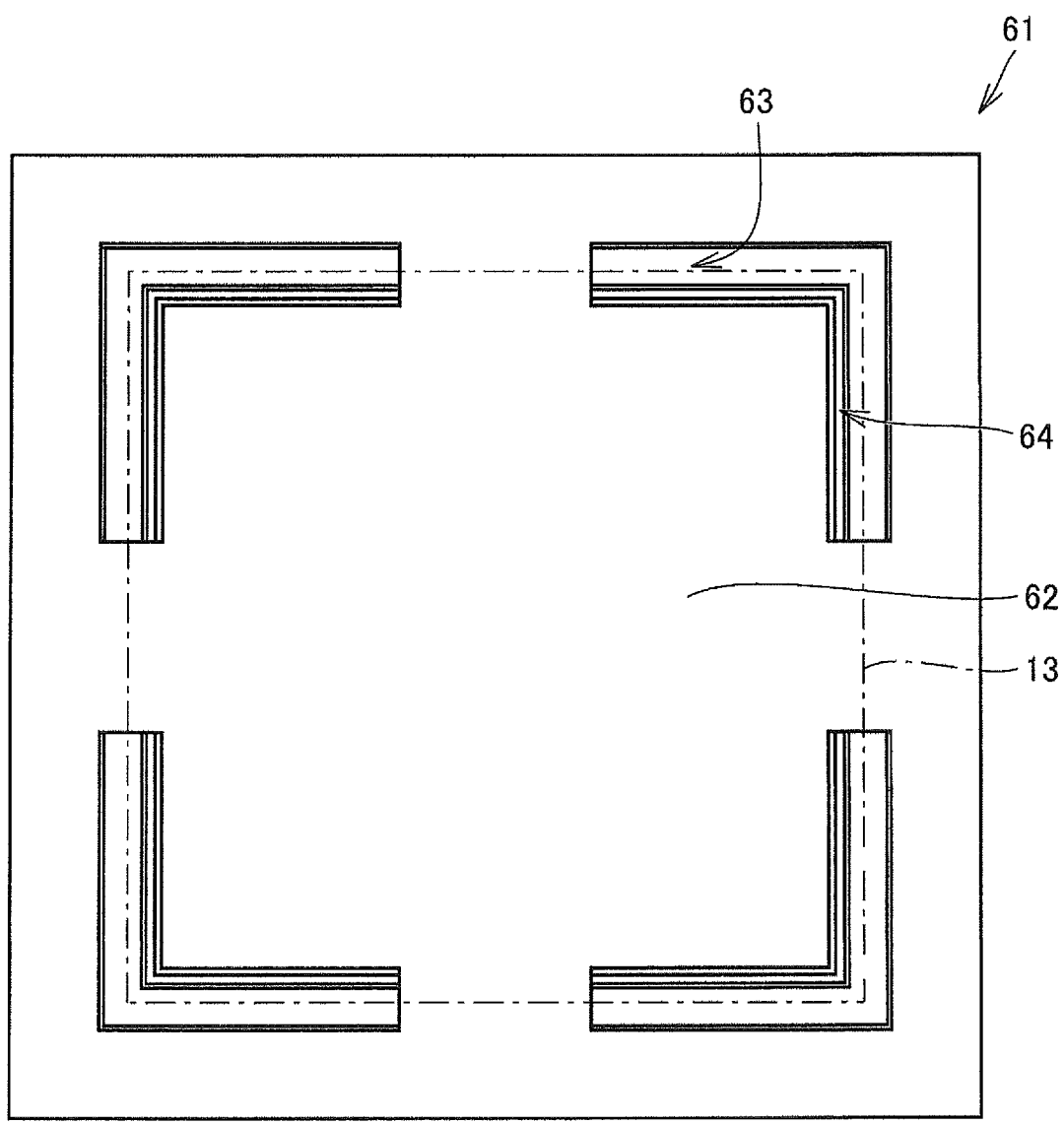
FIG. 6 is a drawing illustrating the way in which a base plate provided in a semiconductor apparatus according to still another embodiment appears in a plan view as viewed in the thickness direction.

It may be noted that the recess in the above-described embodiments has been described as forming a continuous loop in a plan view as viewed in the thickness direction of the base plate 12. This is not a limiting example, and the recess may have the following configuration. FIG. 6 is a drawing illustrating the configuration of a base plate of a semiconductor apparatus according to still another embodiment.

In reference to FIG. 6, a base plate 61 of the semiconductor apparatus according to still another embodiment has a surface 62. The surface 62 has groove-shape recesses 63 situated opposite the exposed outer-perimeter area in a plan view as viewed in the thickness direction of the base plate 61. The recesses 63 each have a deeper area 64 that is deeper than the remaining area and that is situated beside an inner-side sidewall in the plan view as viewed in the thickness direction of the base plate 61. The multiple recesses 63 are disposed at spaced intervals in a circumferential direction along the outer perimeter of the metal plate 13 in the plan view as viewed in the thickness direction of the base plate 61. In the illustrated example, four of these are provided at the positions corresponding to the four corners of the rectangular metal plate 13. This arrangement allows the recesses 63 to be provided at more proper locations.

The above-described embodiments may be configured such that a different angle is used for the angle between the inner-side sidewall 52 and the outer-side sidewall 53. Further, the portions at which the surface 31 meets the inner-side sidewall 52 and the sidewall 42 may be rounded (i.e., beveled) into an arc shape. Moreover, the wall faces constituting the deeper areas 51 and 64 may include a curved surface.

In the above-described embodiments, the depth of the deeper areas 51 and 64 has been described as being less than or equal to the thickness of the bonding material 14. Notwithstanding this, the depth and the like of the deeper areas 51 and 64 may be selected as desired, depending on the configuration of the semiconductor apparatus 11.

In the above-described embodiments, the deeper area 51 is configured such that the width thereof increases toward the upper end (i.e., the mouth of the opening) thereof as shown in FIG. 3 and the like. This is not a limiting example, and each of the inner-side sidewall 52 and the outer-side sidewall 53 may be configured to extend parallel to the thickness direction of the base plate 12 and 61. Further, a different sloping angle may be used for the inner-side sidewall 52 and the outer-side sidewall 53. Moreover, the portion at which the inner-side sidewall 52 meets the area 20 adjoining the deeper area 51 may be rounded (i.e., beveled) into an arc shape. Moreover, the wall faces constituting the deeper area 51 may include a curved surface. For example, in the cross-section illustrated in FIG. 3, the portions at which the inner-side sidewall 52 and the outer-side sidewall 53 meet the bottom surface 54 may be rounded into an arc surface.

All the embodiments disclosed herein are examples only, and should be interpreted as non-limiting in any aspects. The scope of the present invention is not defined by the descriptions provided heretofore, but is defined by the claims. Any modifications representing and within the equivalent scope of the claims are intended to be within the scope of the present invention.

DESCRIPTION OF REFERENCE SYMBOLS 11 semiconductor apparatus
12, 61 base plate
13 metal plate
14, 17 bonding material
15 insulating plate
16 circuit member
18, 19 semiconductor device
20, 28, 44, 47 area
21 encapsulating material
22, 23 terminal
24 outer frame
25, 26, 27 outer perimeter
29, 49 plating layer
31, 32, 33, 34, 35, 36, 37, 62 surface
38, 39 bonding wire
41, 63 recess
42, 43, 52, 53 sidewall
44, 54 bottom surface
45, 46 end
47 portion
51, 64 deeper area

The invention claimed is:

1. A semiconductor apparatus comprising:
a base plate;
a metal plate disposed on the base plate;
a bonding material disposed between the base plate and the metal plate to be in surface-to-surface contact with the base plate and the metal plate to bond the metal plate to the base plate;
an insulating plate disposed on the metal plate;
a circuit member disposed on the insulating plate to be in surface-to-surface contact with the insulating plate;
a semiconductor device mounted on the circuit member; and
an encapsulating material covering the metal plate, the bonding material, the insulating plate, the circuit member, and the semiconductor device to encapsulate an area over the base plate,
wherein a bottom surface area of the metal plate along an outer perimeter of the metal plate is not covered with the bonding material,
wherein the base plate has a groove-shape recess that is disposed along the outer perimeter of the metal plate to face toward the bottom surface area,
wherein the recess has an area having a first depth and a deeper area deeper than the first depth, and the deeper area is disposed beside an inner-side sidewall of the recess when an inner side is defined as being situated further inside, away from the outer perimeter of the metal plate,
wherein at least a portion of the deeper area has the bonding material disposed therein.

2. The semiconductor apparatus as claimed in claim 1, wherein the inner-side sidewall and an upper surface of the base plate placed in contact with the bonding material are configured to meet each other at an obtuse angle.

3. The semiconductor device as claimed in claim 1, wherein the deeper area is configured such that a width thereof increases toward an upper end thereof.

4. The semiconductor apparatus as claimed in claim 1, wherein a depth of the deeper area from the area having the first depth is configured to be less than or equal to a thickness of the bonding material.

5. The semiconductor apparatus as claimed in claim 1, wherein the bonding material is solder, and the inner-side sidewall is provided with a plating layer that has higher solder wettability than a surface of the base plate facing the metal plate.

6. The semiconductor apparatus as claimed in claim 1, wherein the bonding material is solder, and at least a portion of the bottom surface area of the metal plate is provided with a plating layer that has lower solder wettability than a surface of the metal plate facing the base plate.

7. The semiconductor apparatus as claimed in claim 1, wherein a shortest distance between the semiconductor device and a bottom surface of the deeper area in a plan view as viewed in the thickness direction of the base plate is configured to be greater than a distance between an upper surface of the circuit member and the bottom surface of the deeper area in the thickness direction of the base plate.

8. The semiconductor apparatus as claimed in claim 1, wherein the recess forms a continuous loop in a plan view as viewed in the thickness direction of the base plate.

9. The semiconductor apparatus as claimed in claim 1, wherein a plurality of said recesses are disposed at spaced intervals in a circumferential direction along the outer perimeter of the metal plate.

10. A semiconductor apparatus comprising:
a base plate;
a metal plate disposed on the base plate;
a bonding material disposed between the base plate and the metal plate to be in surface-to-surface contact with the base plate and the metal plate to bond the metal plate to the base plate;
an insulating plate disposed on the metal plate;
a circuit member disposed on the insulating plate to be in surface-to-surface contact with the insulating plate;
a semiconductor device mounted on the circuit member; and
an encapsulating material covering the metal plate, the bonding material, the insulating plate, the circuit member, and the semiconductor device to encapsulate an area over the base plate,
wherein a bottom surface area of the metal plate along an outer perimeter of the metal plate is not covered with the bonding material,
wherein the base plate has a groove-shape recess that is disposed along the outer perimeter of the metal plate to face toward the bottom surface area,
wherein the recess has an area having a first depth and a deeper area deeper than the first depth, and the deeper area is disposed beside an inner-side sidewall of the recess when an inner side is defined as being situated further inside, away from the outer perimeter of the metal plate,
wherein at least a portion of the deeper area has the bonding material disposed therein,
wherein the inner-side sidewall and an upper surface of the base plate placed in contact with the bonding material are configured to meet each other at an obtuse angle,
wherein the deeper area is configured such that a width thereof increases toward an upper end thereof,
wherein a depth of the deeper area from the area having the first depth is configured to be less than or equal to a thickness of the bonding material,
wherein the bonding material is solder, and the inner-side sidewall is provided with a plating layer that has higher solder wettability than a surface of the base plate facing the metal plate,
wherein at least a portion of the bottom surface area of the metal plate is provided with a plating layer that has lower solder wettability than a surface of the metal plate facing the base plate, and
wherein a shortest distance between the semiconductor device and a bottom surface of the deeper area in a plan view as viewed in the thickness direction of the base plate is configured to be greater than a distance between an upper surface of the circuit member and the bottom surface of the deeper area in the thickness direction of the base plate.

11. The semiconductor apparatus as claimed in claim 10, wherein the recess forms a continuous loop in a plan view as viewed in the thickness direction of the base plate.

12. The semiconductor apparatus as claimed in claim 10, wherein a plurality of said recesses are disposed at spaced intervals in a circumferential direction along the outer perimeter of the metal plate.

* * * * *